(12) United States Patent
Georgakos

(10) Patent No.: US 8,819,602 B2
(45) Date of Patent: Aug. 26, 2014

(54) CIRCUIT ANALYZER SYSTEMS AND METHODS

(75) Inventor: Georg Georgakos, Fraunberg (DE)

(73) Assignee: Infineon Technologies AG, Neubiberg (DE)

(*) Notice: Subject to any disclaimer, the term of this patent is extended or adjusted under 35 U.S.C. 154(b) by 115 days.

(21) Appl. No.: 13/548,460

(22) Filed: Jul. 13, 2012

(65) Prior Publication Data

US 2014/0019928 A1 Jan. 16, 2014

(51) Int. Cl.
*G06F 17/50* (2006.01)

(52) U.S. Cl.
USPC .................. 716/100; 716/106; 716/133

(58) Field of Classification Search
USPC ............ 716/100, 106–109, 132–133
See application file for complete search history.

(56) References Cited

U.S. PATENT DOCUMENTS

| 6,564,162 | B1 | 5/2003 | Erskine |
| 7,015,732 | B1* | 3/2006 | Holloway et al. ............ 327/143 |
| 2009/0218631 | A1* | 9/2009 | Zhu et al. ...................... 257/369 |
| 2010/0329062 | A1* | 12/2010 | Campbell et al. ............. 365/226 |

* cited by examiner

*Primary Examiner* — Paul Dinh

(74) *Attorney, Agent, or Firm* — Eschweiler & Associates, LLC

(57) ABSTRACT

Structures of a circuit are identified. Voltages are propagated to the identified structures. Additionally, internal node voltages for the identified structures are obtained. Asymmetrical operating conditions are identified.

20 Claims, 11 Drawing Sheets

100

102

US 8,819,602 B2

CIRCUIT ANALYZER SYSTEMS AND METHODS

BACKGROUND OF THE INVENTION

Circuits are integral components of modern devices ranging from cellular phones to automotive vehicles. Circuits are included in almost all devices. Circuits perform functions such as communications, control systems, and the like.

Circuit design is the process of designing circuits that can be utilized in devices. The process begins with identifying requirements or specifications for the circuit. The specifications can include voltage outputs, temperature range, operating environment, and the like. Once specifications are established, schematic diagrams are generated that meet the specifications. Simulations can then be performed to verify operation of the circuit design. Once verified, layouts and materials can be identified that are needed to implement the circuit design. Prototypes can then be built and tested for proper operation. A final design is then created from the preliminary layouts and circuit design. The final design includes methods of construction, materials, and the like. Further testing can be performed until final approval is obtained.

The process of circuit design can consume large amounts of time and resources. Further, there are no guarantees that a design can be realized that meets all of the specifications.

DETAILED DESCRIPTION OF THE INVENTION

Figure 1A:
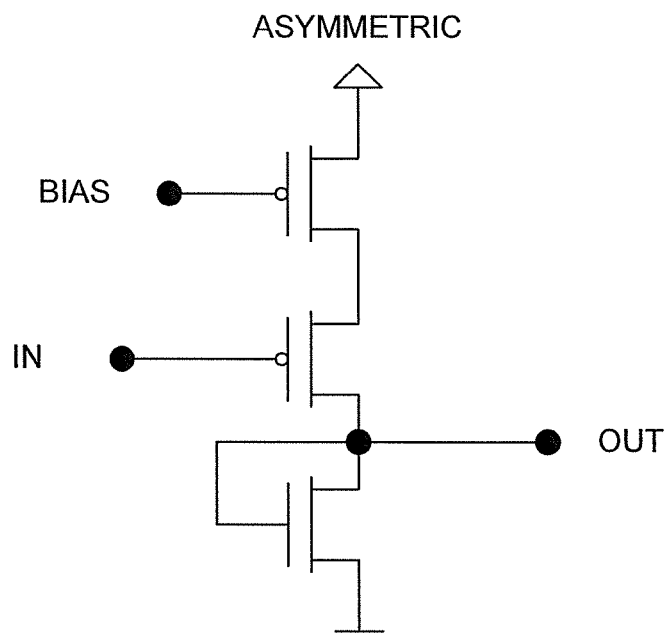
FIG. 1A is a circuit diagram of an asymmetrical circuit 100.

The present invention will now be described with reference to the attached drawing figures, wherein like reference numerals are used to refer to like elements throughout, and wherein the illustrated structures and devices are not necessarily drawn to scale.

The present invention includes embodiments that provide automatic verification of analog and mixed signal circuits. The embodiments include, for example, systems and methods verifying circuits based on structure recognition, voltage propagation, and following design rules to mitigate time intensive simulations and the need for critical input stimuli.

The term circuits or circuit also includes circuit designs, simulated circuits, and the like.

Circuits can encounter a variety of operating conditions during their lifetime. These include stresses, temperature, humidity, power fluctuations, fabrication conditions, usage, and the like.

It is noted that the operating conditions of circuits, such as analog and mixed signal circuits can cause these circuits to degrade over their lifetime. For example, transistor parameters within the circuits can degrade, which can cause the performance of a device or overall system to also degrade.

There are several phenomena that can result in circuit performance degradation for critical structures, such as transistors. Some examples include bias temperature instability (BTI), hot carrier injection (HCI), and the like.

Hot carrier injection is where an electron or a "hole" gains sufficient kinetic energy to overcome a potential barrier necessary to break an interface state. The term "hot" refers to the effective temperature used to model carrier density, not to the overall temperature of the device. Since the charge carriers can become trapped in the gate dielectric of a MOS transistor, the switching characteristics of the transistor can be degraded or permanently changed.

BTI or negative bias instability (NBTI) is a phenomenon that can increase threshold voltages and decrease drain current and transconductance over time. The degradation worsens over time and is facilitated by high temperatures. Traps within devices can be created over time, which lead to the BTI.

The performance degradation phenomena are problematic by themselves. However, the problem can be exacerbated for asymmetric or unbalanced circuit designs. Voltage levels and currents at various internal nodes and/or critical structures can vary and lead to undesired or unexpected behavior.

A symmetric circuit or structure has a symmetry of its component or structures about a line mid-way between sides or halves. Thus, both sides of the circuit or structure have substantially similar characteristics including, symmetrical currents (equal and opposite), symmetrical voltages, symmetrical impedances, and the like. Thus, variations or degradations in components are typically mirrored by both sides, thereby lessening the impact of the variations or degradations.

FIG. 1A is a circuit diagram of an asymmetrical circuit 100. The circuit is provided as an example in order to facilitate an understanding of the present invention. It is appreciated that the circuit 100 can be a structure or circuit within another circuit.

The circuit 100 is an amplifier comprised of two series connected PMOS transistors and a gate to drain connected NMOS transistor. The circuit 100 includes an upper bias transistor, an input transistor, and a lower load transistor. An output is provided at a drain of the load transistor.

An input signal (IN) is received at a gate of the input transistor. A bias voltage is received or applied at a gate of the upper bias transistor. An output signal (OUT) is provided at a drain of the load transistor.

The circuit 100 or circuit structure is not symmetrical. As a result, variations or degradations of the transistors directly lead to a variations or degradations of the output signal.

Figure 1B:
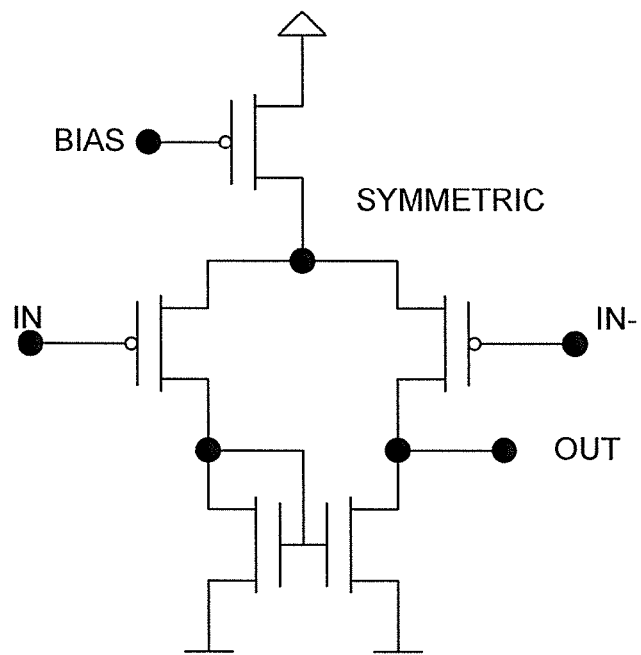
FIG. 1B is a circuit diagram of a symmetrical circuit 102.

FIG. 1B is a circuit diagram of a symmetrical circuit 102. The circuit is provided as an example in order to facilitate an understanding of the present invention.

The circuit 102 is a differential amplifier and provides a substantially similar function as the amplifier 100, shown above. The circuit includes an upper bias PMOS transistor, a pair of balanced PMOS input transistors, and a current mirror comprising a pair of NMOS transistors.

The upper bias PMOS transistor receives a bias voltage at its gate. The pair of input transistors receive a differential input signal. The pair of NMOS transistors provide an output signal at a drain of one of the NMOS transistors. The pairs of transistors, both the NMOS and PMOS pairs, are balanced so that degradation is likely to equally apply to both transistors of the pairs. As a result, the degradation occurs for both sides, which mitigates the overall impact or degradation of the circuit 102, including the output signal.

Systems and methods of the invention can be utilized to identify critical structures of circuits and identify asymmetrical and/or symmetrical operating conditions in the identified structures. Once identified and/or verified, changes to the circuit can be performed to enhance the symmetry and operation of the circuits.

Figure 2:
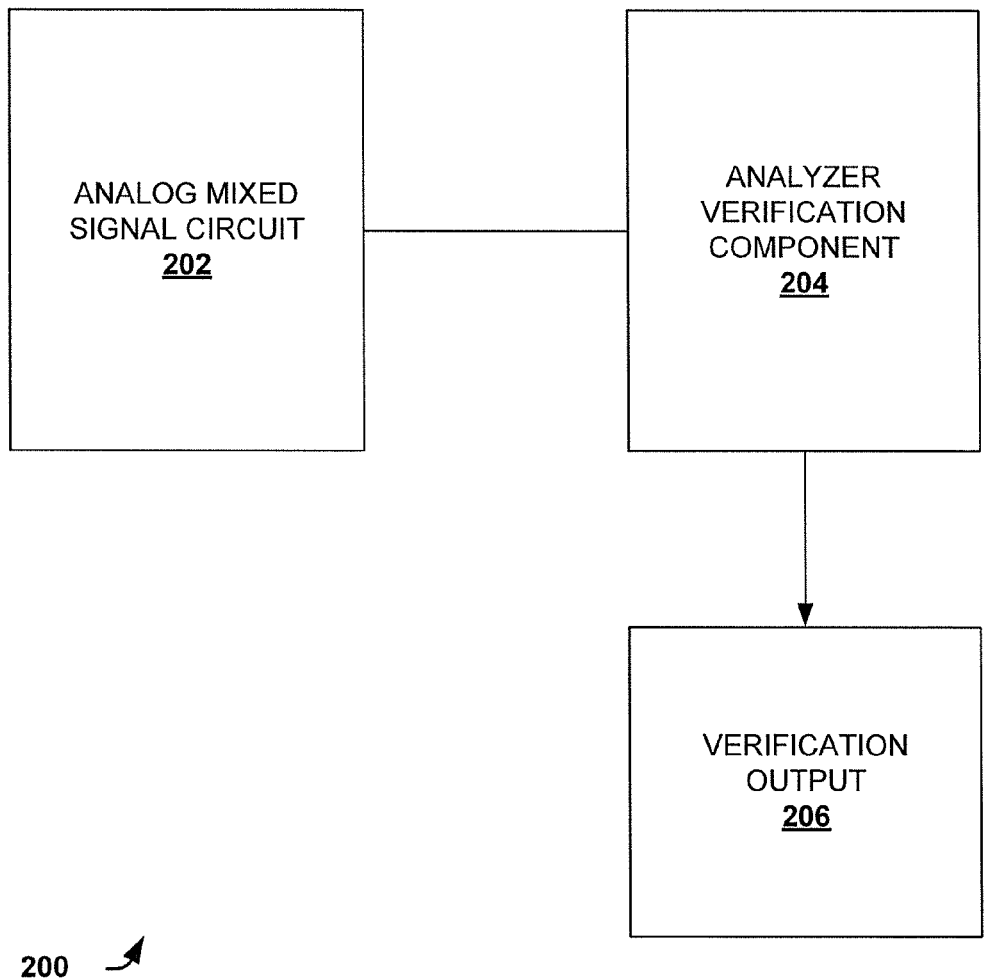
FIG. 2 is a block diagram of a verification system 200 in accordance with an embodiment of the invention.

FIG. 2 is a block diagram of a verification system 200 in accordance with an embodiment of the invention. The system 200 facilitates operation of circuitry with symmetric conditions in order to mitigate the impact of phenomena degradation over time.

The system 200 includes an analyzer verification component 204 and operates on an analog mixed signal circuit 202 or circuit design. The analyzer verification component 204 produces a verification output 206 that verifies symmetric operation or identifies asymmetric conditions or operations of critical structures of the circuit 202. Thus, the verification output 206 can be utilized to alter or enhance the circuit 202.

The analog mixed signal circuit 202 includes one or more critical structures, as described above. The circuit 202 also includes other structures, components and/or internal nodes. Further, the circuit 202 receives one or more supply voltages and is coupled to ground. The circuit 202 can include one or more outputs, such as for supply power, current, signals, information, and the like. The circuit 202 also includes one or more modes of operation. The modes of operation include normal function mode, power down mode, sleep mode, and the like.

The verification component 204 analyzes symmetric characteristics of the circuit 202, including symmetric operation and symmetric conditions. The verification component 204 analyzes the circuit 202 to identify critical structures or components. In one example, the verification component 204 identifies symmetrical structures of the circuit 200. Then, the verification component determines which of the identified structures are critical.

Additionally, the verification component 204 also identifies the one or more modes of operation for the circuit 202 by analysis and/or being provided with the information. In one example, a user inputs the one or more modes of operation for the circuit 202. Finally, the component 204 propagates various voltages to internal nodes of the circuit 202 and compares critical structures for each side of the circuit 202 to identify asymmetric operating conditions of the critical structures. The critical structures associated with the asymmetric operating conditions are also identified. The associated critical structures can be referred to as asymmetric critical structures.

Generally, the critical structures are structures of the circuit 202 that have a substantial impact on performance and/or power consumption. Examples of critical structures include transistor pairs, differential input pairs, current mirrors, terminals and the like.

The asymmetric structures, asymmetric operating conditions, and other information are provided as a verification output 206. The other information can include identification of matching critical structures, propagated voltages at internal nodes, the one or more modes of operation, and the like.

The circuit 202 can be modified in order to reduce the presence or occurrence of asymmetric characteristics, including asymmetric structures and asymmetric operating conditions. Thus, the circuit 202 is modified, if needed, to have more or all symmetric operating conditions for the critical structures.

As a result, the circuit 202, once modified to improve symmetry, is more resistant to performance degradation by individual components or structures of the circuit 202.

Figure 3:
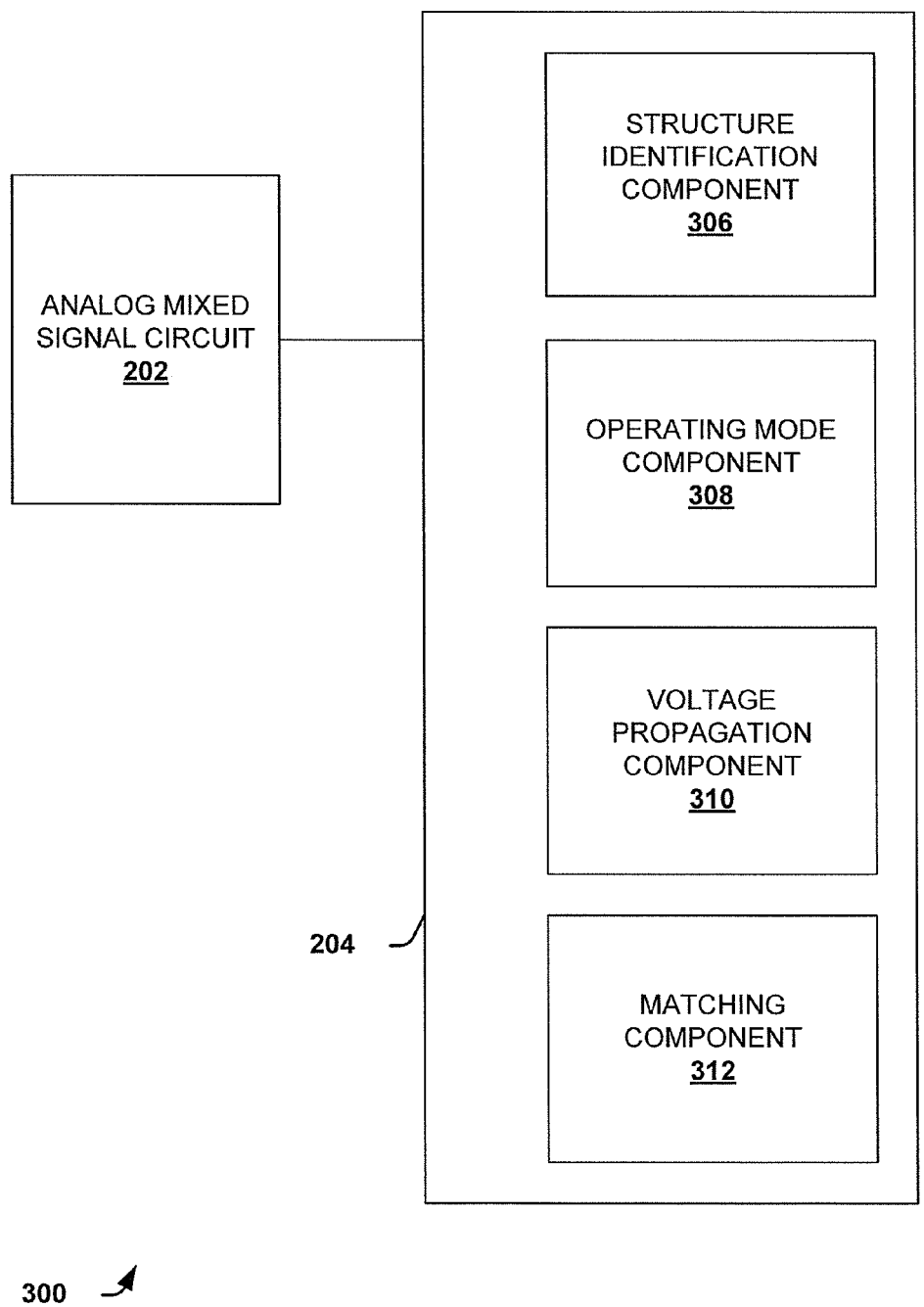
FIG. 3 is a block diagram of a verification system 300 in accordance with an embodiment of the invention.

FIG. 3 is a block diagram of a verification system 300 in accordance with an embodiment of the invention. The system 300 facilitates operation of circuitry with symmetric conditions in order to mitigate the impact of phenomena degradation over time. The system 300 is similar to the system 200 of FIG. 2.

The system 300 includes an analyzer verification component 204 and operates on an analog mixed signal circuit 202 or circuit design. The analyzer verification component evaluates symmetric operation and/or identifies asymmetric conditions of the circuit. Thus, the verification output can be utilized to alter or enhance the circuit 202.

The analog mixed signal circuit 202 includes a first side and a second side. The circuit 202 includes critical structures or components and internal nodes. The circuit 202 also receives one or more supply voltages and is coupled to ground. Further, the circuit 202 can include one or more outputs, such as outputs for power supply, current, signals, information, and the like. The circuit 202 includes one or more modes of operation. The modes of operation include normal function mode, power down mode, sleep mode, and the like.

The verification component 204 analyzes symmetric characteristics of the circuit 202, including symmetric operation and symmetric conditions. Further, the verification component provides a verification output that includes asymmetrical characteristics and other information related to the circuit 202.

The verification component 204, in this example, includes a structure identification component 306, an operating mode component 308, a voltage propagation component 310, and a matching component 312. The structure identification component 306 identifies critical structures and components of the circuit 202. Examples of critical structures include transistor pairs, differential input pairs, current mirrors, terminals and the like.

The operating mode component 308 identifies the one or more modes of operation for the circuit 202. The operating mode component 308 analyzes the circuit 202 to determine the one or more modes of operation. As stated above, the modes can include normal function mode, power down mode, sleep mode, and the like.

The voltage propagation component 310 utilizes voltages and propagates the voltages to the internal nodes of the circuit 202. In one example, the propagation component propagates externally supplied power or signals, such as supply voltages. The propagated voltages are provided for the one or more modes of operation and, for example, can be equal to the supply voltages or lower than the supply voltages to consider voltage drops across the components of the circuit. Further, a set of rules are assigned for the nodes and components.

In one example, the rules include assigning short circuits to resistors, open circuits to capacitors, and short or open circuits to transistors, depending on their gate voltage. In the event that a particular voltage cannot be assigned to a node, separate cases are made for the one or more voltages. Thus, each case is evaluated for the circuit 202 for each voltage.

The matching component 312 evaluates or matches internal node voltages for all cases and operating modes to the terminals of the critical structures or components. Further, the matching component 312 identifies matching components or structures for each side of the circuit 202 and evaluates voltages for matching components. Based on the evaluation, the matching component identifies asymmetrical operating conditions and asymmetrical critical structures associated with the identified asymmetrical operating conditions. Additionally, the matching component 312 can also identify symmetrical operating conditions.

The matching component 312 obtains the operating modes from the operating mode component. Additionally, the matching component 312 assigns the propagated voltages for each case as provided by the voltage propagation component 310.

The matching component 312 generates the verification output, which includes identified asymmetrical operating conditions and asymmetrical critical structures associated with the identified asymmetrical operating conditions. Further, the verification output can include other information from the evaluation including, for example, propagated internal voltages, cases, the identified critical structures, and the like.

The verification output can be utilized to facilitate the design of the circuit. For example, a circuit designer provided with the identified asymmetrical structures modify the design to improve symmetry and/or overall performance.

Figure 4:
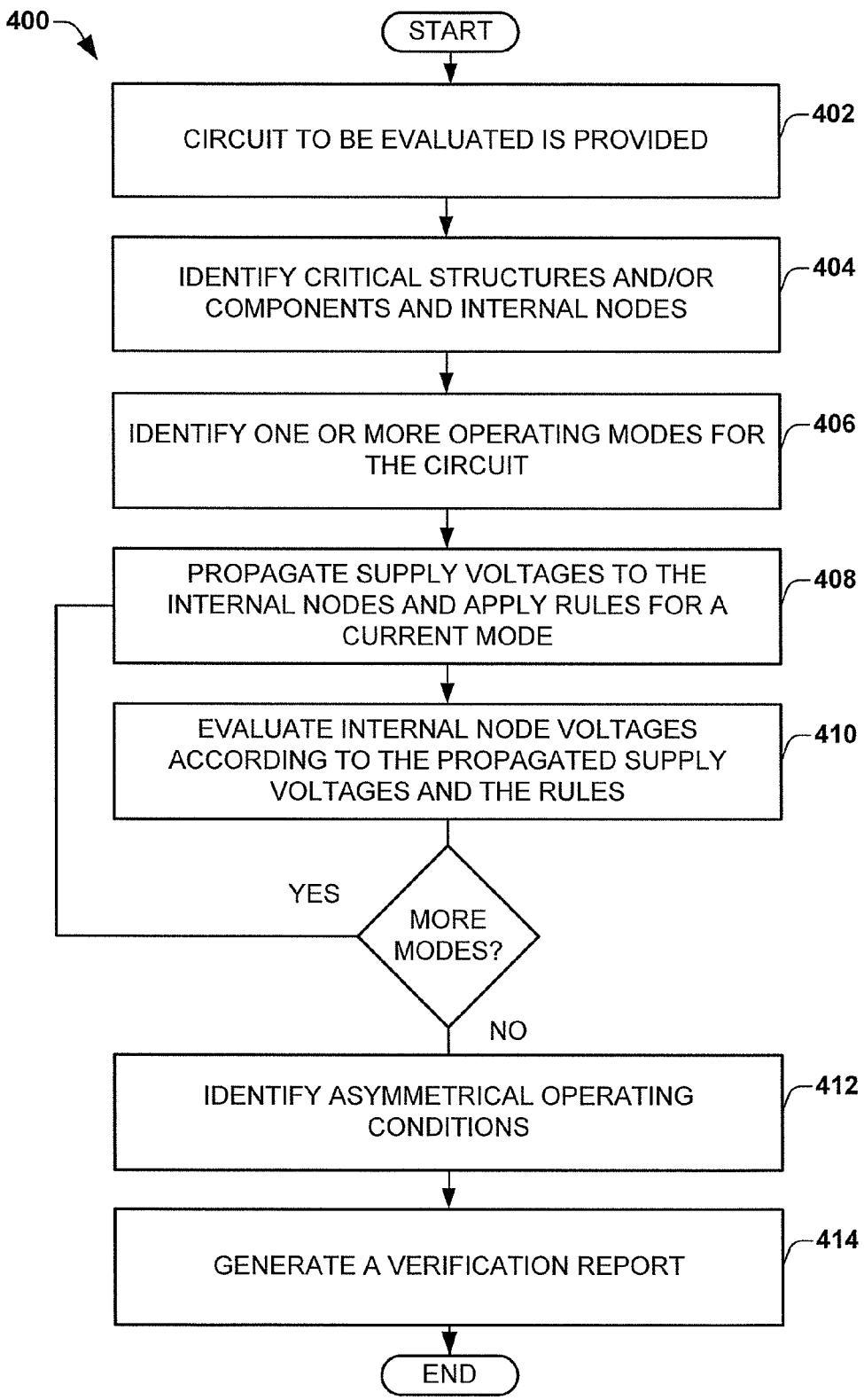
FIG. 4 is a flow diagram illustrating a method 400 of performing circuit design verification in accordance with an embodiment of the invention.

FIG. 4 is a flow diagram illustrating a method 400 of performing circuit design verification in accordance with an embodiment of the invention. The method 400 can be utilized to identify asymmetrical structures and/or components and facilitate circuit design.

The method 400 begins at block 402, wherein a circuit to be evaluated is provided. The circuit includes a first side and a second side, where symmetry between both sides is desired. The circuit can include analog circuits, linear circuits, amplifiers, receivers, transmitters, and the like.

Critical structures and/or components of the circuit are identified at block 404. The critical structures typically include pairs of devices or components, such as analog amplifiers, transistors, and the like. The critical structures include devices and components that have a substantial impact on operation of the circuit. Further, they may also include significant power consumption compared with other components of the circuit. Internal nodes are also identified for the identified critical structures.

The critical structures and internal nodes are identified by using a suitable mechanism. In one example, the structures and nodes are provided. In another example, automated structure recognition methods, e.g. utilizing interactive user input or a list of transistors and their connections, are utilized to obtain the critical structures and internal nodes.

One or more operating modes are identified at block 406. The identified modes can include, for example, normal operating mode, sleep mode, deep sleep mode, off, and the like. In one example, there is only one operating mode. In another example, there are a plurality of operating modes.

The operating modes can include operating characteristics or parameters for the identified critical structures and nodes. Thus, each mode can include specific voltages, currents, and the like.

The operating modes can be identified using a suitable technique. In one example, the modes are identified by a user input or other information associated with the circuit. In another example, operation of the circuit is simulated or analyzed, e.g. by utilizing automated pattern or structure recognition methods, to identify or estimate the operating modes.

For each of the operating modes, a number of blocks are performed. Voltages are propagated to the identified structures and/or nodes at block 408. A set of propagation rules is applied to carry the voltages to the internal nodes and structures. In one example, the rules include the following assignments: resistors=short circuits, capacitors=open circuits, and transistors=short circuits or open circuits (depending on their gate voltage). It is appreciated that other propagation rules can be utilized.

There may be situations when a single voltage cannot be applied to an internal node. In such situations, multiple cases are generated for the multiple voltages and the circuit is evaluated for each case. For example, a node can be assigned a first voltage value for a first case and a second voltage value for a second case. The multiple voltage situation can occur when, for example, a gate voltage is not known or can vary to unknown values.

Node voltages are evaluated for the identified structures at block 410 according to the propagated voltages and the propagation rules. The node voltages for the critical structures are compared for the matching devices. As a result, matching of the critical structures can be measured or gauged.

The matching or evaluating can show similar or substantially similar internal voltages for the critical structures, which include matching pairs for the first and second sides. Alternately, the matching or evaluating can show substantial variations for the node voltages for the critical structures, which indicates a lack of symmetry.

Once the block 408 and 410 are performed for each case and mode, asymmetrical operating conditions and associated critical structures are identified at block 412. The asymmetrical structures are critical structures or components that have associated identified asymmetrical operating conditions.

A verification report is generated at block 414. The verification report includes the identified asymmetrical structures and other verification information. The identified asymmetrical structures can include an amount of mismatch or deviation. Further, the modes of operation in which the asymmetrical behavior is exhibited can be provided.

The other verification information included in the verification report can vary according to implementation. The verification information can include information about other structures of the circuit and information related thereto. For example, the verification information can include matching structures and specify how close their characteristics are.

The verification report can then be utilized to modify or improve the circuit. As a result, for example, a circuit designer is enabled to modify the circuit, such as using different components, voltages, passive components, and the like.

While method 400 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein.

Also, one or more of the acts depicted herein may be carried out in one or more separate acts and/or phases.

Figure 5:
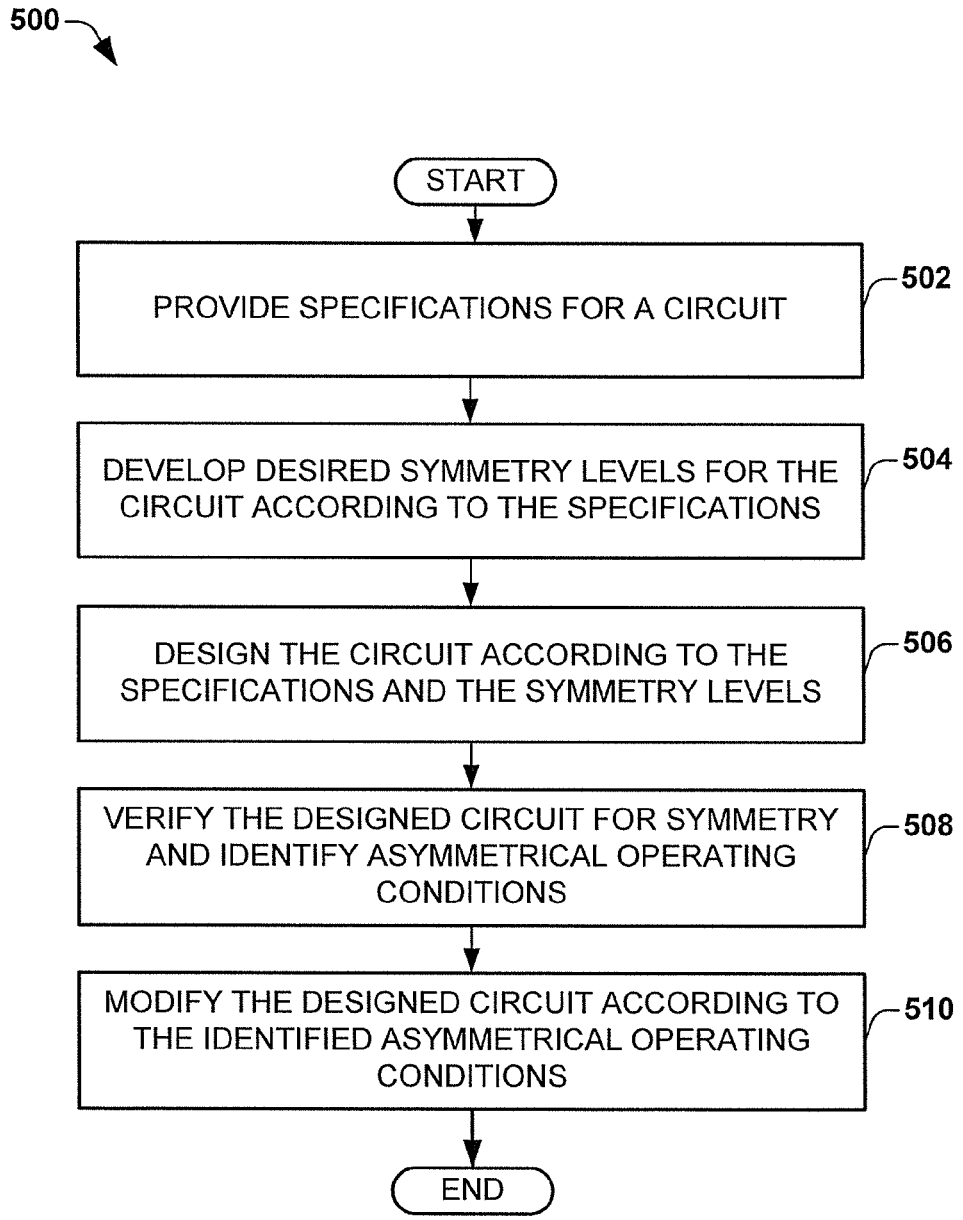
FIG. 5 is a flow diagram illustrating a method 500 of performing and verifying circuit design in accordance with an embodiment of the invention.

FIG. 5 is a flow diagram illustrating a method 500 of performing and verifying circuit design in accordance with an embodiment of the invention. The method 500 facilitates symmetry and overall operation by automatically evaluating a designed circuit for symmetry.

Beginning at block 502, specifications for a circuit to be designed are provided. The specifications include, for example, voltage output, temperature range, input voltages, input/output signals, and the like.

Symmetry or tolerance levels are developed for the circuit according to the specifications at block 504. Typically, circuits that are expected to endure harsher conditions, such as temperature variations, stress, and the like, require more symmetry in order to be more resistant to overall circuit degradation. The symmetry levels can be specified in suitable terms, such as voltage tolerances for pairs of devices.

The circuit is designed according to the specifications and the symmetry levels at block 506. Schematics and the like can be generated. Components and structures can be selected. Generally, the circuit is designed with a first side and a second side, wherein the first side and the second side are substantially symmetrical.

The designed circuit is verified for symmetry at block 508 and asymmetrical operating conditions are identified. The designed circuit is verified using systems and/or methods, such as those shown above:

The designed circuit is modified at block 510 according to the identified asymmetrical operating conditions. The associated critical structures can be modified to facilitate symmetry. Additionally, other modifications of the circuit can be performed to facilitate symmetry.

As a result, the modified circuit is typically more resilient to operating conditions, such as temperature, aging, stress, and the like because of the improved symmetry of critical components.

FIGS. 6A to 6F are examples provided to facilitate understanding of the invention. The examples can be read in conjunction with the above systems and methods. Further, the examples can be utilized in conjunction with the above systems, methods and variations thereof.

Figure 6A:
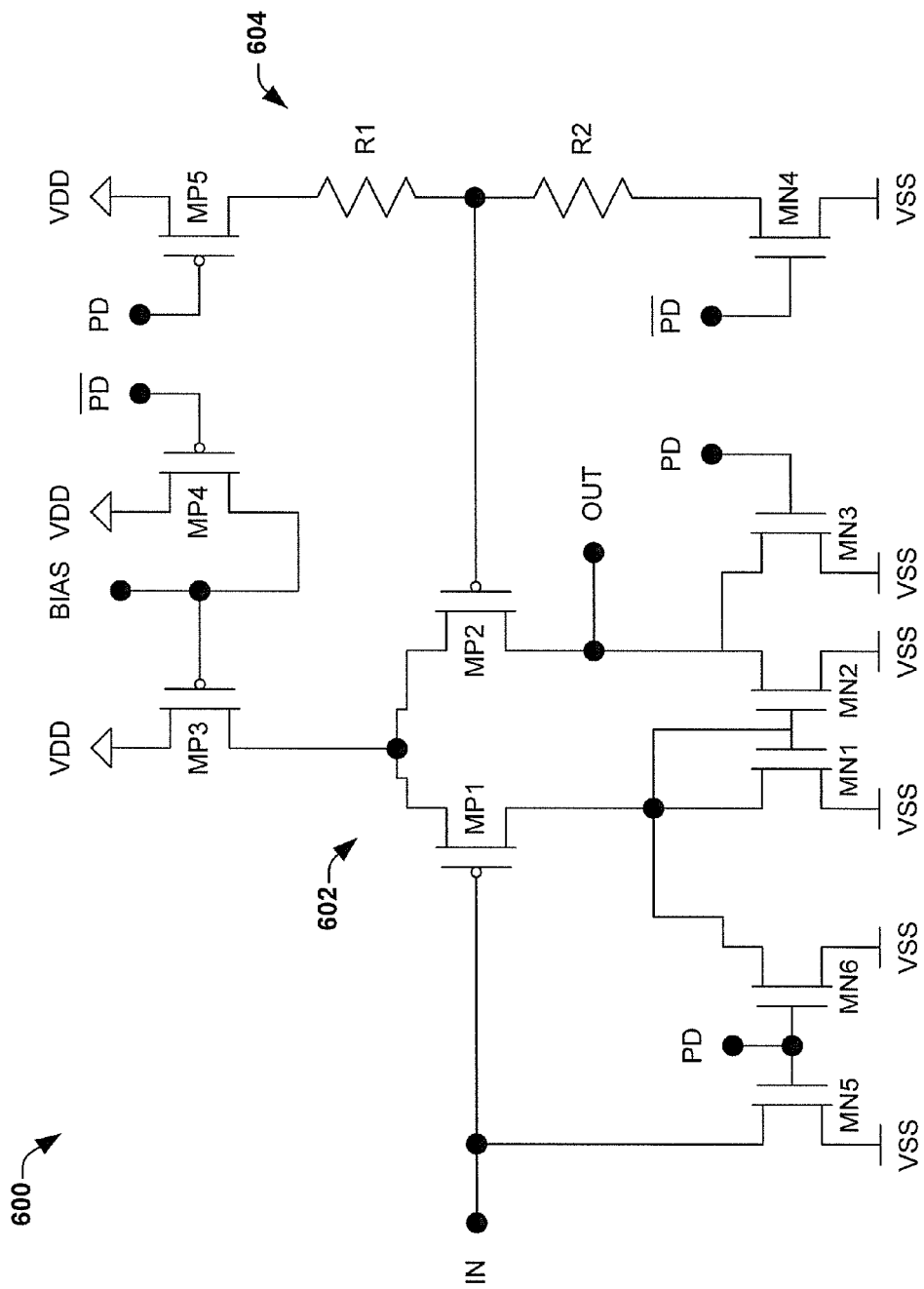
FIG. 6A is a circuit diagram illustrating an amplifier circuit 600 in accordance with an embodiment of the invention.

FIG. 6A is a circuit diagram illustrating an amplifier circuit 600 in accordance with an embodiment of the invention. The circuit 600 is a differential amplifier and includes a differential input 602 and a voltage divider 604.

The circuit 600 includes NMOS transistors MN1 to MN6 and PMOS transistors MP1 to MP5. The differential input 602 comprises a pair of PMOS transistors, MP1 and MP2. The voltage divider 604 comprises two resistors, R1 and R2.

The circuit 600 includes two operating modes controlled by a power down input (PD). When PD is 0 (zero), the operating mode is normal. When PD is 1 (one), the operating mode is power down mode, which is a reduced power consumption mode.

Figure 6B:
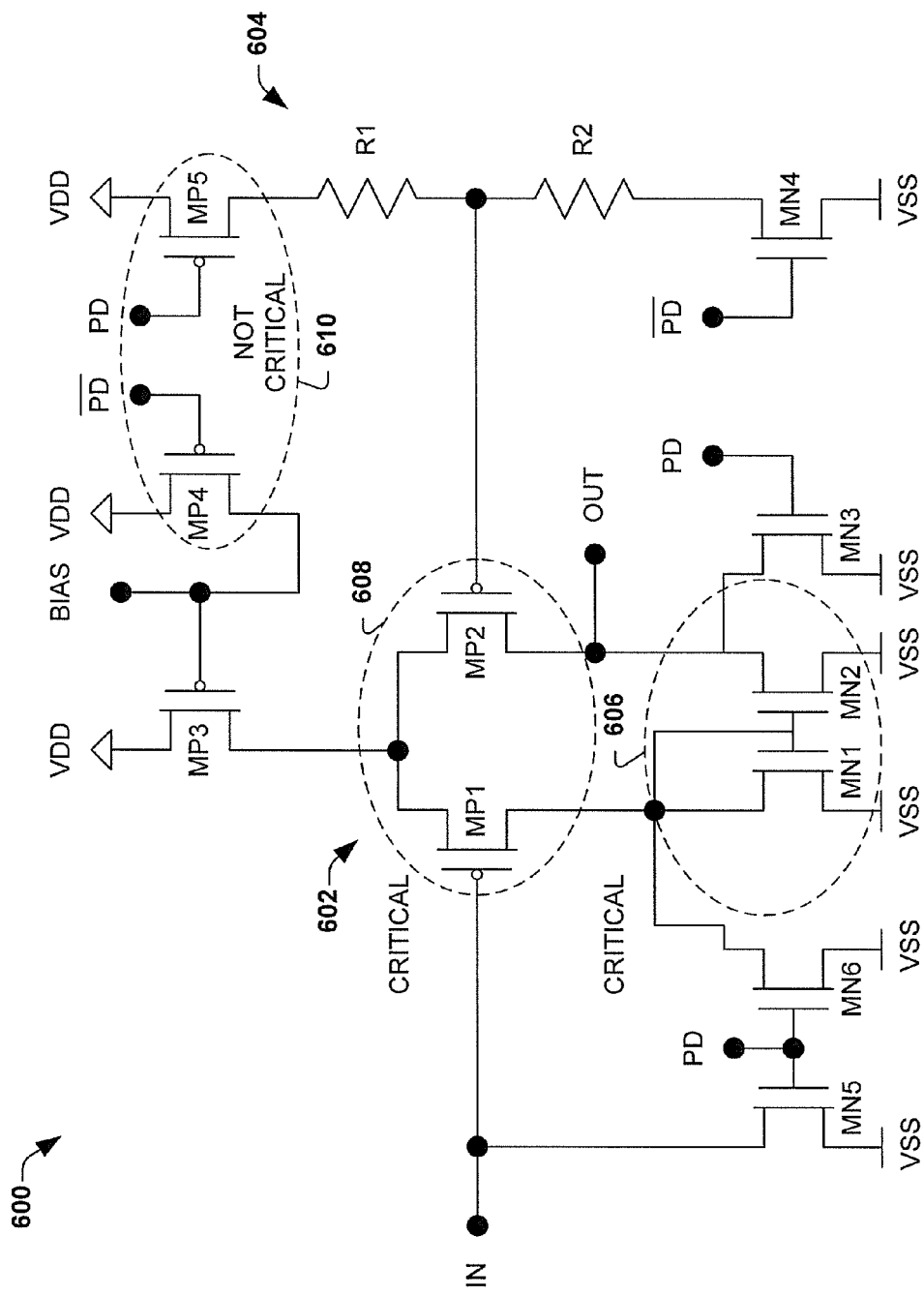
FIG. 6B is a circuit diagram illustrating identification of critical structures of the amplifier circuit 600 in accordance with an embodiment of the invention.

FIG. 6B is a circuit diagram illustrating identification of critical structures of the amplifier circuit 600 in accordance with an embodiment of the invention.

The critical structures can be identified in a suitable manner, such as described above. In on example, generally symmetrical structures are identified, and then analyzed to determine if they are critical.

A first critical structure is identified at 606. The structure 606 includes NMOS transistors MN1 and MN2. A second critical structure is identified at 608 and includes PMOS transistors MP1 and MP2. The second structure 608 includes the differential input 602. A third structure 610 is identified, but determined not to be a critical structure. The third structure 610 includes PMOS transistors MP4 and MP5. Gates for the transistors MP4 and MP5 are controlled or activated according to the power mode signal PD. Thus, the third structure 610 is not providing substantial power outputs or signals and they operate for control purposes.

In contrast, the first critical structure 606 and the second critical structure 608 receive signals (input signal) and provide output signals. Thus, asymmetrical operating conditions can cause substantial degradation to the provided output signals and to performance of the overall circuit 600.

Figure 6C:
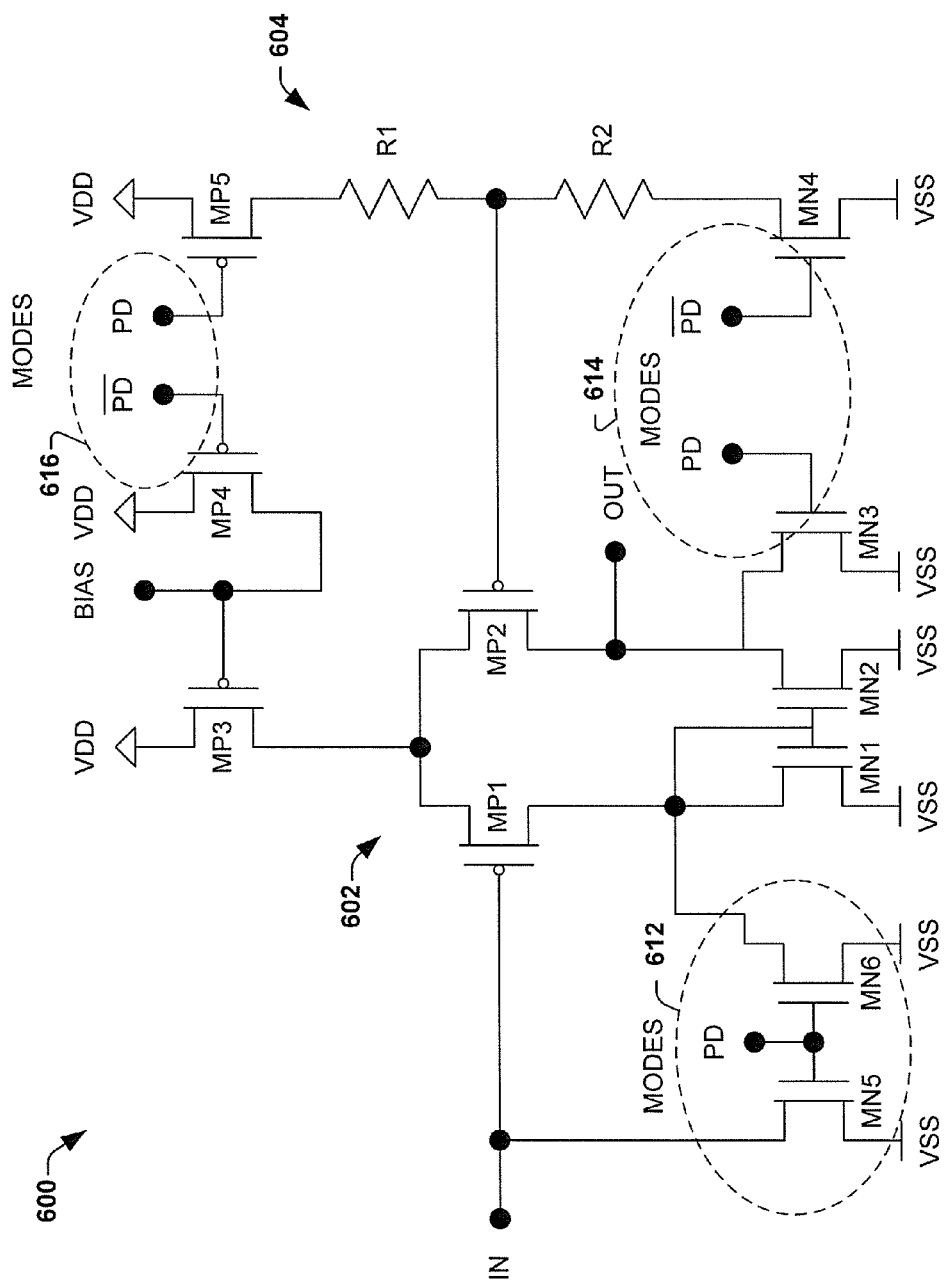
FIG. 6C is a circuit diagram illustrating identification of modes of operation for the amplifier circuit 600 in accordance with an embodiment of the invention.

FIG. 6C is a circuit diagram illustrating identification of modes of operation for the amplifier circuit 600 in accordance with an embodiment of the invention.

Here, there are two operating modes identified; normal operating mode and power down mode. The operating modes are controlled by the power down input (PD). When PD is 0 (zero), the operating mode is normal. When PD is 1 (one), the operating mode is power down mode, which is a reduced power consumption mode.

The modes are identified at locations 612, 614, and 616 by identifying logic or control signals. Here, the logic or control signal is the power down input.

Figure 6D:
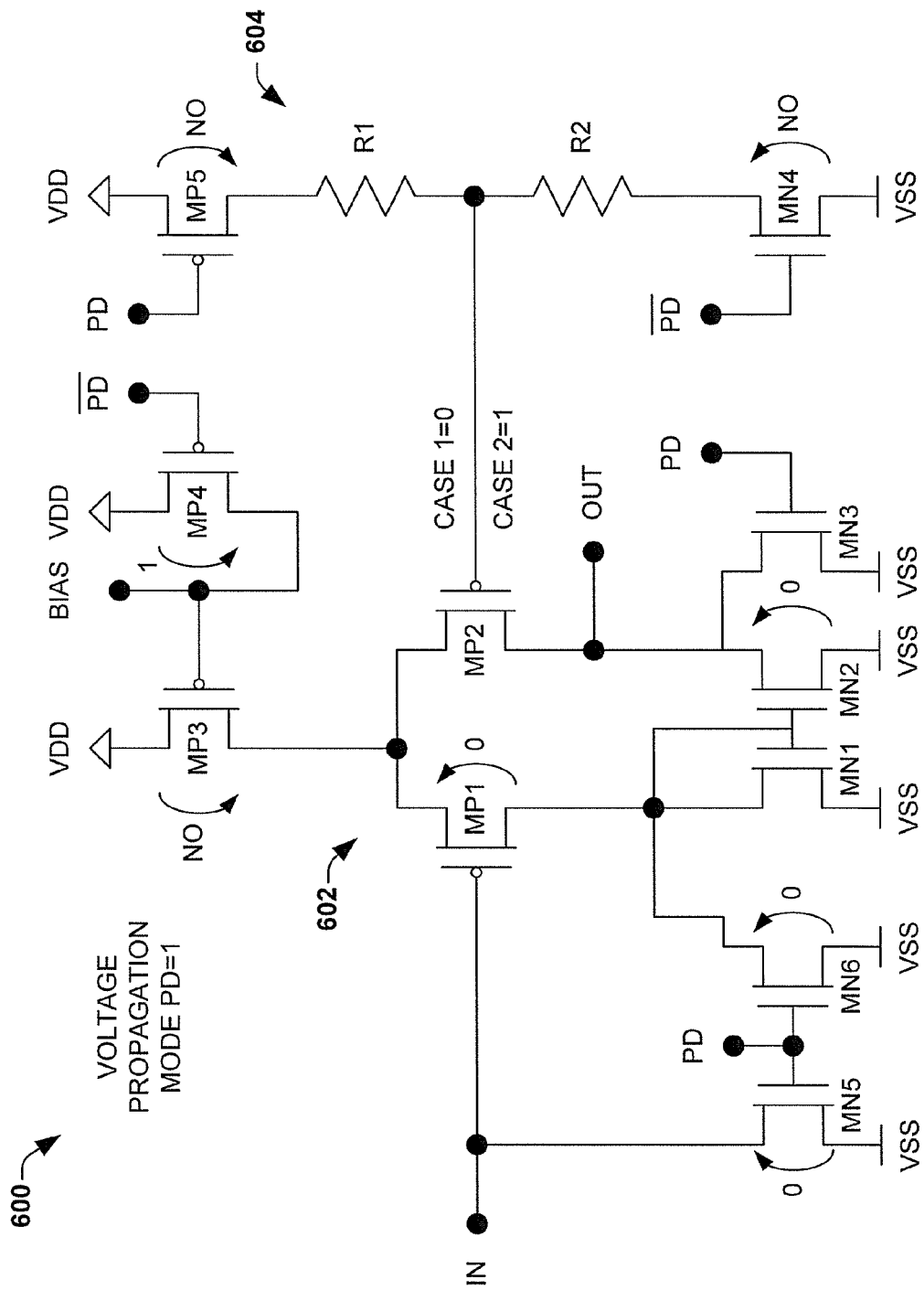
FIG. 6D is a circuit diagram illustrating voltage propagation for a first mode of operation for the amplifier circuit 600 in accordance with an embodiment of the invention.

FIG. 6D is a circuit diagram illustrating voltage propagation for a first mode of operation for the amplifier circuit 600 in accordance with an embodiment of the invention. In the first mode, PD is equal to 1, which represents the power down or reduced power mode.

In this mode, PD is set to 1 and voltage values are propagated to the various nodes, components and structures of the circuit.

The diagram shows how zero values are propagated up from transistors MN5, MN6, MN2, and the like. As a result, a zero value is propagated to drain of MP1 and the output (OUT). In the same way a one value is propagated down from MP4 leading to a one value at the gate of MP3 which prevents a voltage propagation through MP3. In the same way no voltage can be propagated through MP5 and MN4 thus no voltage can be applied to gate of MP2. According to the invention two cases will be generated, a first case with gate of MP2 equals 0, and a second case with gate of MP2 equals 1.

Figure 6E:
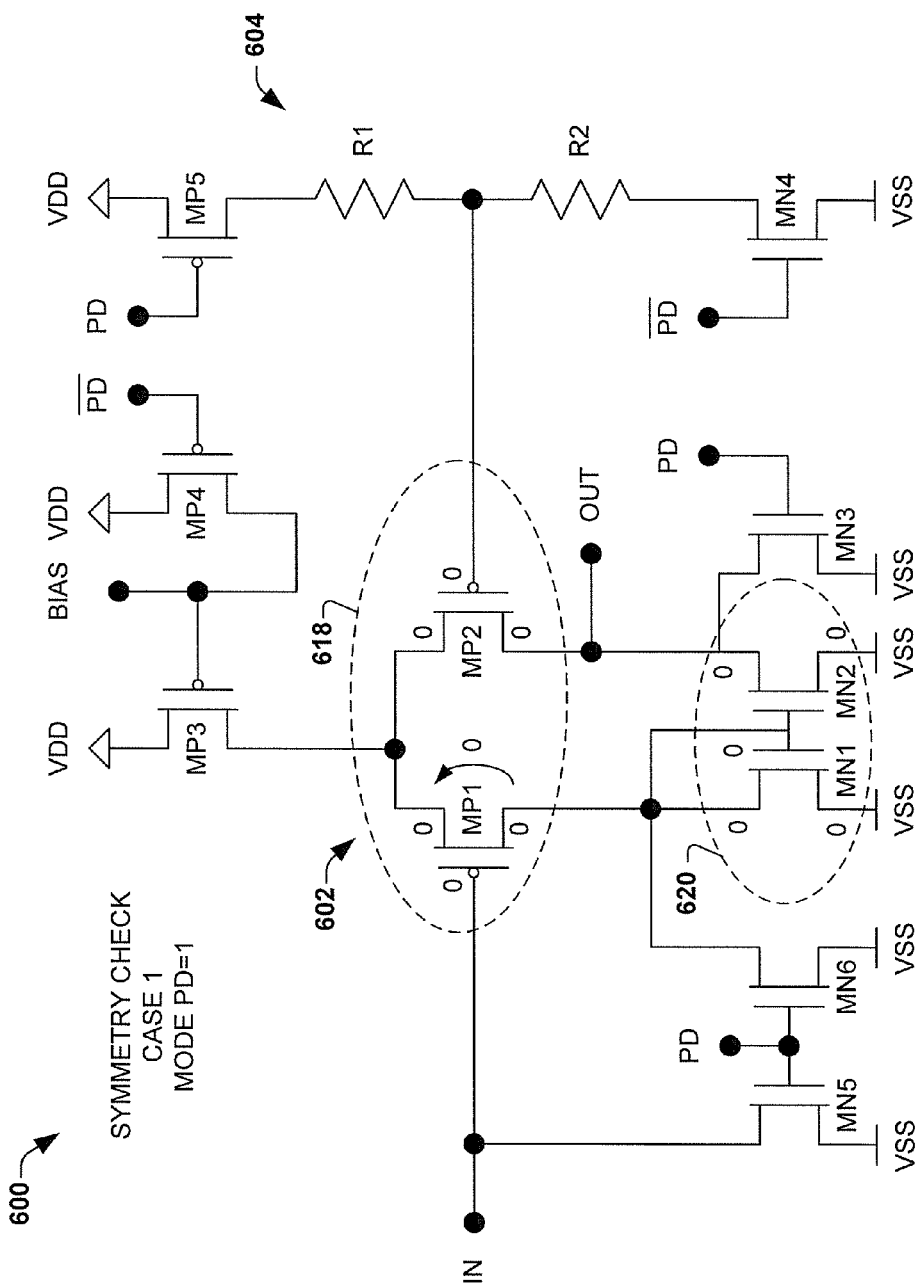
FIG. 6E is another circuit diagram illustrating voltage propagation for a first case of a first mode of operation wherein asymmetric operating conditions for the critical structures of the circuit 600 are identified.

FIG. 6E is another circuit diagram illustrating voltage propagation for a first case of the first mode of operation wherein asymmetric operating conditions for the critical structures of the circuit 600 are identified.

Conditions are evaluated from the propagated voltages for nodes associated with the critical structures. At 618, zero values are propagated to both sides of the critical structure. Thus, zero values are present at sources, gates, and drains for transistors MP1 and MP2. It can be seen that for this case, the critical structure at 618 is operating symmetrically, or has symmetric operating conditions.

Again, conditions are evaluated from the propagated voltages for nodes associated with the critical structure at 620. Here, zero values are seen at sources, gates, and drains for transistors MN1 and MN2. Thus, the critical structure at 620 has symmetric operating conditions for this mode and case.

Figure 6F:
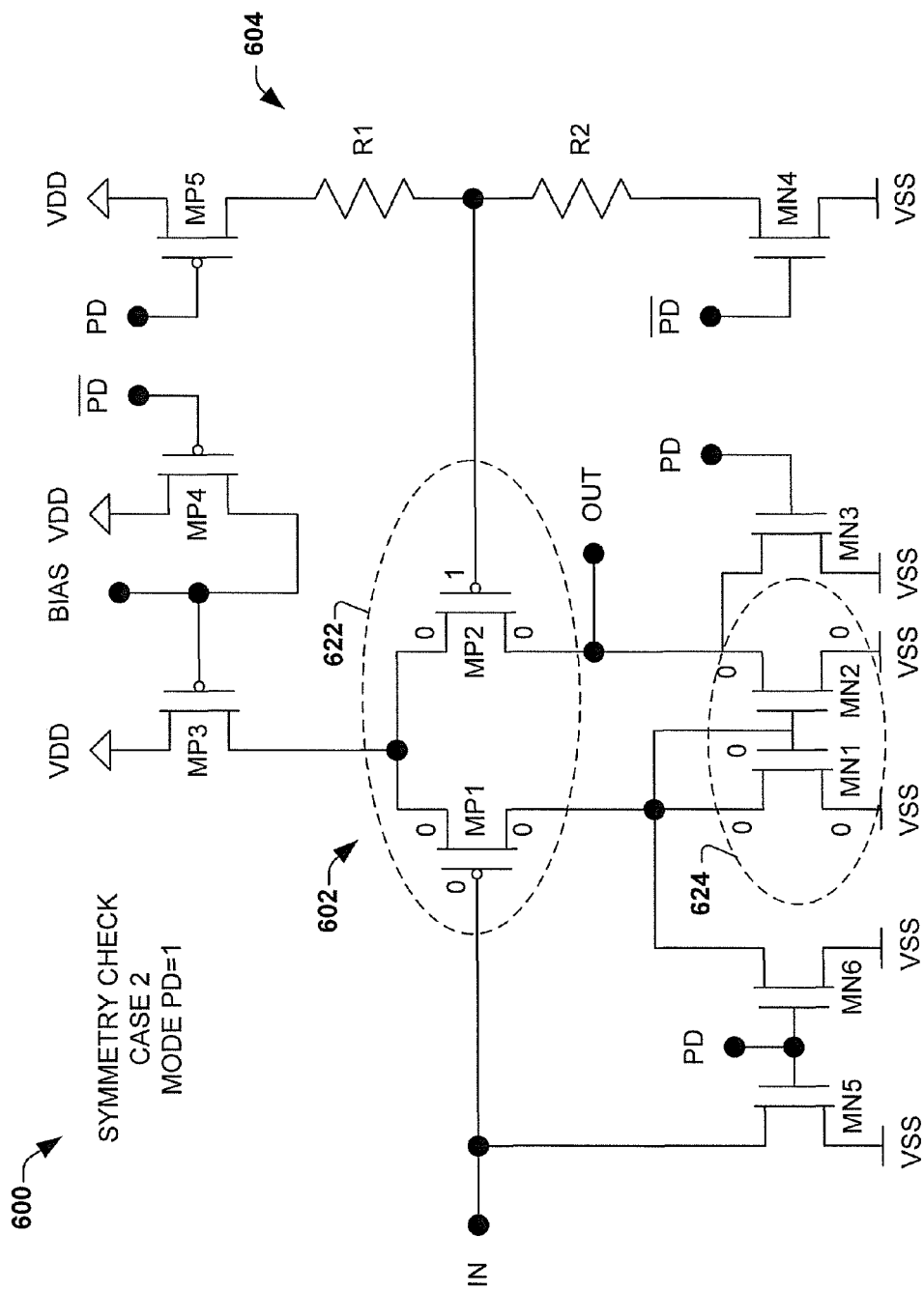
FIG. 6F is a circuit diagram illustrating voltage propagation for a second case of a first mode of operation wherein asymmetric operating conditions for the critical structures of the circuit 600 are identified.

FIG. 6F is a circuit diagram illustrating voltage propagation for a second case of the first mode of operation wherein asymmetric operating conditions for the critical structures of the circuit 600 are identified.

At the critical structure 622, 0 values are propagated to sources and drains of transistors MP1 and MP2; and to a gate of MP1. However, a 1 value for the second case is propagated to a gate of MP2. Thus, an asymmetric operating condition is identified at 622.

Conditions are evaluated from the propagated voltages for nodes associated with the critical structure at 624. Here, zero values are seen at sources, gates, and drains for transistors MN1 and MN2. Thus, the critical structure at 620 has symmetric operating conditions for this mode and case.

An analysis similar to that shown above is then performed for a second mode, when PD=0. the normal operating mode. Here, all the PD inputs are set to 0 and a substantially similar analysis is performed.

The above example is provided to facilitate an understanding of the various embodiments and not to limit the invention to a particular circuit or implementation.

It is appreciated that the claimed subject matter may be implemented as a method, apparatus, or article of manufacture using standard programming and/or engineering techniques to produce software, firmware, hardware, or any combination thereof to control a computer to implement the disclosed subject matter (e.g., the circuits or systems shown in FIGS. 1-3, etc., are non-limiting examples of circuits or devices that may be used to implement methods 400 and 500, and variations thereof).

One embodiment of the invention relates to a circuit analyzer system. The system can be utilized to verify and/or improve symmetry of a circuit. The circuit includes structures that can include symmetrical components, such as pairs of transistors. The system includes a structure identification component, an operating mode component, a voltage propagation component, and a matching component. The structure identification component is configured to identify structures of a circuit. The operating mode component is configured to identify one or more modes of operation for the circuit. The voltage propagation component is configured to supply or propagate voltages to the structures and internal nodes of the circuit. The matching component is configured to obtain internal node voltages for the critical structures and to identify asymmetrical operating conditions of the structures of the circuit.

Another embodiment of the present invention relates to performing circuit design verification for symmetry. Critical structures of a circuit are identified. Voltages are propagated to the identified structures and internal nodes according to propagation rules for each mode. Additionally, node voltages for the identified structures are evaluated or determined according to the propagated voltages and the propagation rules. Asymmetrical operating conditions are identified according to the evaluated node voltages.

Yet another embodiment of the invention relates to performing circuit design and verification. A circuit is designed to have symmetrical, critical structures. A symmetry verification report is automatically generated without requiring user or designer interaction. The verification report identifies asymmetrical operating conditions. The circuit is modified to correct the identified asymmetrical operating conditions.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A circuit analyzer system comprising:
 a structure identification component configured to identify structures of a circuit that have a substantial impact on circuit performance;
 a voltage propagation component configured to propagate voltages to the identified structures of the circuit; and
 a matching component configured to obtain internal node voltages for the structures and to identify asymmetrical operating conditions for the structures based on the propagated voltages.

2. The system of claim 1, further comprising an operating mode component configured to identify one or more modes of operation for the circuit.

3. The system of claim 1, wherein the structures include differential input pairs and current mirrors.

4. The system of claim 3, wherein the structures include one or more transistor pairs.

5. The system of claim 4, wherein the structures have a substantial impact on power consumption for the circuit.

6. The system of claim 1, wherein the structure identification component is configured to identify symmetrical structures and determine if the symmetrical structures substantially impact circuit performance and power consumption of the circuit.

7. The system of claim 1, further comprising an operating mode component configured to identify a power down mode and a normal operation mode of the circuit.

8. The system of claim 1, wherein the voltages are applied to internal nodes and the structures according to rules, wherein the rules include setting capacitors to open circuit, resistors to short circuit, and transistors to open circuit or short circuit according to gate voltages.

9. The system of claim 1, wherein the voltage propagation component is configured to generate multiple cases for the structures wherein multiple voltages apply.

10. The system of claim 1, wherein the matching component is configured to provide a verification output, which includes the identified asymmetrical operating conditions and associated structures.

11. A method of performing circuit design verification, the method comprising:
 identifying structures of a circuit that have a substantial impact on circuit performance by using a computer;
 propagating voltages to the identified structures by assigning propagated voltages to the identified structures according to propagation rules for each mode of one or more operating modes;
 evaluating node voltages for internal nodes associated with the identified structures according to the propagated voltages and the propagation rules; and
 identifying asymmetrical operating conditions for the identified structures according to the evaluated node voltages.

12. The method of claim 11, further comprising identifying one or more operating modes of the circuit.

13. The method of claim 12, wherein identifying the one or more operating modes comprises performing simulations with the circuit to identify the one or more operating modes.

14. The method of claim 11, wherein identifying the structures comprises identifying symmetrical structures and determining function.

15. The method of claim 11, wherein the propagation rules include assigning a voltage value for transistors according to their gate voltages.

16. The method of claim 11, further comprising identifying internal nodes of the circuit.

17. The method of claim 11, further comprising designing the circuit according to specifications and for symmetry prior to identifying the structures of the circuit.

18. The method of claim 11, wherein identifying asymmetrical operating conditions comprises evaluating the node voltages for pairs of transistors within the structures, wherein a first transistor of each pair of transistors is located on a first side of the circuit and a second transistor of each pair of transistors is located on a second side of the circuit.

19. A method of performing circuit design and verification comprising:
developing tolerance levels for symmetrical structures, wherein the tolerance levels specify an amount of symmetry for the symmetrical structures and the symmetrical structures substantially impact performance of the circuit;
designing a circuit having the symmetrical structures;
automatically generating a symmetry verification report, wherein the verification report identifies asymmetrical operating conditions related to the symmetrical structures by using a computer; and
modifying the circuit to correct the identified asymmetrical operating conditions.

20. The method of claim 19, wherein automatically generating a symmetry verification report comprises:
identifying structures of the circuit;
identifying one or more operating modes of the circuit;
propagating voltages to the identified structures for the one or more operating modes;
evaluating node voltages of internal nodes for the circuit; and
identifying the asymmetrical operating conditions according to the evaluated node voltages.

* * * * *